United States Patent
Brekelmans

[19]

[11] Patent Number: 6,044,251
[45] Date of Patent: *Mar. 28, 2000

[54] TV/FM RECEIVER FOR MULTIMEDIA APPLICATIONS

[75] Inventor: Johannes H. A. Brekelmans, Singapore, Singapore

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/779,410

[22] Filed: Jan. 7, 1997

[30] Foreign Application Priority Data

Jan. 10, 1996 [SG] Singapore ................ 9600125

[51] Int. Cl.$^7$ ........................................ H04B 1/16
[52] U.S. Cl. ............... 455/150.1; 455/142; 455/143; 455/144; 455/189.1; 455/191.1
[58] Field of Search .................... 455/142, 143, 455/144, 150.1, 188.1, 180.1, 190.1, 180.2, 188.2, 189.1, 187.1, 191.1, 196.1, 318, 319, 192.3, 193.2, 139; 381/3, 4

[56] References Cited

U.S. PATENT DOCUMENTS

| | | | |
|---|---|---|---|
| 4,088,959 | 5/1978 | Sumi ........................... | 325/459 |
| 4,272,788 | 6/1981 | Ogita ........................... | 381/3 |
| 4,484,221 | 11/1984 | Tults ........................... | 358/191.1 |
| 4,495,650 | 1/1985 | Konishi et al. ............ | 455/144 |
| 4,881,272 | 11/1989 | Eguchi ........................ | 455/143 |
| 5,068,918 | 11/1991 | Verheijen et al. ........ | 455/196.1 |
| 5,142,371 | 8/1992 | Lehmann .................... | 455/180.1 |
| 5,148,280 | 9/1992 | Wignot et al. ............ | 358/191.1 |
| 5,321,850 | 6/1994 | Backstrom et al. ...... | 455/139 |
| 5,491,715 | 2/1996 | Flaxl ........................... | 455/193.2 |
| 5,524,289 | 6/1996 | Koblitz et al. ............ | 455/192.3 |
| 5,710,993 | 1/1998 | Brekelmans ................ | 455/180.1 |

FOREIGN PATENT DOCUMENTS

| | | |
|---|---|---|
| 0401932B1 | 6/1990 | European Pat. Off. . |
| 6-121240 | 4/1994 | Japan . |

*Primary Examiner*—Daniel S. Hunter
*Assistant Examiner*—Thuan T. Nguyen
*Attorney, Agent, or Firm*—Steven R. Biren

[57] ABSTRACT

A receiver for receiving reception signals of a first type, for example, TV signals, and reception signals of a second type, for example, FM-radio signals. The receiver may be used in multimedia applications. In the receiver, a single tuner TUN frequency converts a reception signal RFS into an intermediate frequency signal IFS. For relatively small-size implementations, the receiver is a single conversion receiver for both types of reception signals, the single conversion being effected in the tuner TUN. Depending on whether a first-type or second-type reception signal is desired, the tuner TUN provides the intermediate frequency signal IFS at a first intermediate frequency IF1 or a second intermediate frequency IF2, respectively. The intermediate frequency signal IFS at intermediate frequency IF1 is processed in a first intermediate frequency signal processor IFSP1. Alternatively, the intermediate frequency signal IFS at the second intermediate frequency IF2 is processed in a second intermediate frequency signal processor IFSP2.

12 Claims, 6 Drawing Sheets

TV/FM RECEIVER FOR MULTIMEDIA APPLICATIONS

BACKGROUND OF THE INVENTION

1. Field of the Invention

The invention relates to a receiver for receiving reception signals of a first type, for example, TV signals, and reception signals of a second type, for example, FM-radio signals. The invention also relates to a multimedia apparatus incorporating such a receiver. The receiver may enhance the functionality of the multimedia apparatus with, for example, TV and FM-radio reception. The multimedia apparatus may be in the form of a personal computer (PC) having slots into which add-on cards are plugged. The receiver may be implemented on one of these add-on cards. Accordingly, the PC can access information transmitted by FM-radio and TV stations.

2. Description of the Related Art

A receiver capable of receiving TV and FM-radio signals is described in U.S. Pat. No. 5,148,280. The prior-art receiver comprises a single tuner for both TV and FM-radio reception. The single tuner frequency converts both a selected FM-radio signal and a selected TV signal to a fixed intermediate frequency (IF) signal of approximately 40 MHz. An IF of approximately 40 MHz is common for TV reception.

The IF signal produced by the tuner is processed differently for TV or FM-radio reception. For TV reception, the IF signal is processed in a manner which is very similar to IF signal processing in most present-day TV receivers. The IF signal is applied to a TV IF demodulation unit via a surface acoustic wave (SAW) filter. The TV IF demodulation unit provides a baseband composite video signal and a TV sound carrier signal. The TV sound carrier signal is further processed in a TV sound channel which provides, in response, baseband audio signals.

For FM reception, the IF signal is supplied to a single chip FM-radio integrated circuit (IC) via a filter unit which includes a 43.3 MHz band-pass filter and a 48.65 MHz trap. In the FM-radio IC, the IF signal is frequency-converted to obtain a nominal 10.7 MHz FM IF signal. The FM IF signal is filtered by a ceramic filter arrangement and amplified, detected and decoded in the FM-radio IC. Thus, for FM reception, the prior-art receiver employs a double conversion scheme. The tuner performs a first frequency conversion and the FM-radio IC performs a second frequency conversion.

The filter unit, which is coupled between the tuner and the FM-radio IC, has to satisfy relatively strict requirements in order to avoid excessive distortion of the FM-radio signal to be received. First, the passband of the filter unit needs to be sufficiently close to 43.3 MHz. This requirement follows, among other things, from the frequency characteristic of the tuner, which is haystack-like, and the characteristics of the signals to be received. Secondly, the 46.85 MHz trap included in the filter unit needs to be accurately tuned to that frequency so as to avoid an image reception problem in the second frequency conversion.

Although the receiver described in U.S. Pat. No. 5,148,280 uses a single tuner for both TV and FM-radio reception, implementations of the prior-art receiver will be relatively spacious. The filter unit, which is coupled between the tuner and the FM-radio IC, is built up with discrete capacitors and inductors. In order that the filter unit satisfies the above described requirements, the inductors need to have a certain size. If not, the inductors will have a too low quality factor to achieve an adequate selectivity and accuracy.

SUMMARY OF THE INVENTION

It is an object of the invention to provide a receiver which, with reference to the above described prior-art receiver, is better suited for small-size implementations.

According to one aspect of the invention, there is provided a receiver defined in claim 1 for receiving reception signals of a first and a second type, the receiver comprising a tuner for providing an intermediate frequency signal in response to a reception signal; a first intermediate frequency signal processing arrangement coupled to process said intermediate frequency signal when receiving said first-type reception signals; and a second intermediate frequency signal processing arrangement coupled to process said intermediate frequency signal when receiving said second-type reception signals, characterized in that said receiver is a single conversion receiver, and in that said tuner is arranged to provide said intermediate frequency signal at a first intermediate frequency for processing in said first intermediate frequency signal processing arrangement, and to provide said intermediate frequency signal at a second intermediate frequency for processing in said second intermediate frequency signal processing arrangement.

According to another aspect of the invention, a multimedia apparatus comprises such a receiver.

Yet another aspect of the invention provides a tuning method as defined claim 11 for tuning a receiver, characterized in that the method comprises the steps of rendering the switching element conducting; tuning the oscillator to a desired frequency; rendering the switching element non-conducting; correcting the oscillator to the desired frequency.

Yet another aspect of the invention provides a shielded metal box defined in claim 12 comprising a tuner for providing an intermediate frequency signal in response to a reception signal, characterized in that said tuner is a single conversion tuner arranged to provide said intermediate frequency signal at a first intermediate frequency for processing in said first intermediate frequency signal processing arrangement, and to provide said intermediate frequency signal at a second intermediate frequency for processing in said second intermediate frequency signal processing arrangement.

The invention may be used in the reception of both TV and FM-radio signals. In an example of such a use, a single tuner converts TV signals to a first IF of approximately 40 MHz, and converts FM-radio signals to a second IF of approximately 10.7 MHz. The 10.7 MHz IF signal is processed in an FM IF signal processing section, and the 40 Mhz IF signal is processed in a TV IF signal processing section.

The invention takes the following into consideration. A tuner which is capable of providing two different intermediate frequencies, in accordance with the invention, can be implemented in such a way that it has a relatively small size. Referring to the above example, the tuner which provides the 40 MHz and 10.7 MHz IF can be implemented in such a way that its size is comparable with that of a conventional TV tuner.

The above example may be compared with the prior-art receiver. Due to the fact that the tuner in the example can provide both 40 MHz and 10.7 MHz IF, a second frequency conversion, as in the prior-art receiver, is not necessary. Filter circuits for preventing signal distortion as a result of the second frequency conversion, as in the prior-art receiver, are therefore not needed. Consequently, this leaves room for other circuitry so that the receiver of the present invention is better suited for small-size implementations. Furthermore, in an implementation, the tuner in the above example may in fact have a smaller size than the tuner in the prior-art receiver.

A further advantage is the relatively low cost of implementations in accordance with the invention. Yet a further advantage is the relatively good performance, notably in FM-radio reception.

The invention is particularly suited for multi-media applications. Many multi-media applications use add-on cards of a standard size. As indicated in the opening paragraph, a receiver in accordance with the invention may be implemented on a standard-size add-on card. The relatively small size of the receiver leaves room on the standard-size add-on card for other circuitry, which may further enhance the functionality of the add-on card. It should also be noted that a part of the receiver is preferably housed in a shielded metal box so as to counter interference produced by digital signals in a multi-media apparatus. The smaller the receiver, the less space the shielded metal box will consume, which renders the receiver suitable for a great variety of multimedia applications.

The invention will hereinafter be described in greater detail with reference to examples shown in the drawings. Furthermore, advantageous implementation details claims, will also be described with reference to the examples shown.

DESCRIPTION OF THE PREFERRED EMBODIMENTS

First, the principle of the invention will be further explained with reference to FIG. 1. Secondly, the invention will be described by way of example, with reference to the FIG. 2 tuner which can receive both TV and FM-radio signals. In that respect, implementation aspects of the FIG. 2 tuner will also be discussed with reference to FIGS. 3 to 7, and an example of a multimedia application of the FIG. 2 tuner will be discussed with reference to FIG. 8. Thirdly, advantageous implementation details which are claims, will be highlighted with reference to the examples shown in the Figures. Finally, some remarks are made so as to indicate that the scope of the invention is well beyond the examples shown in the Figures.

Figure 1:
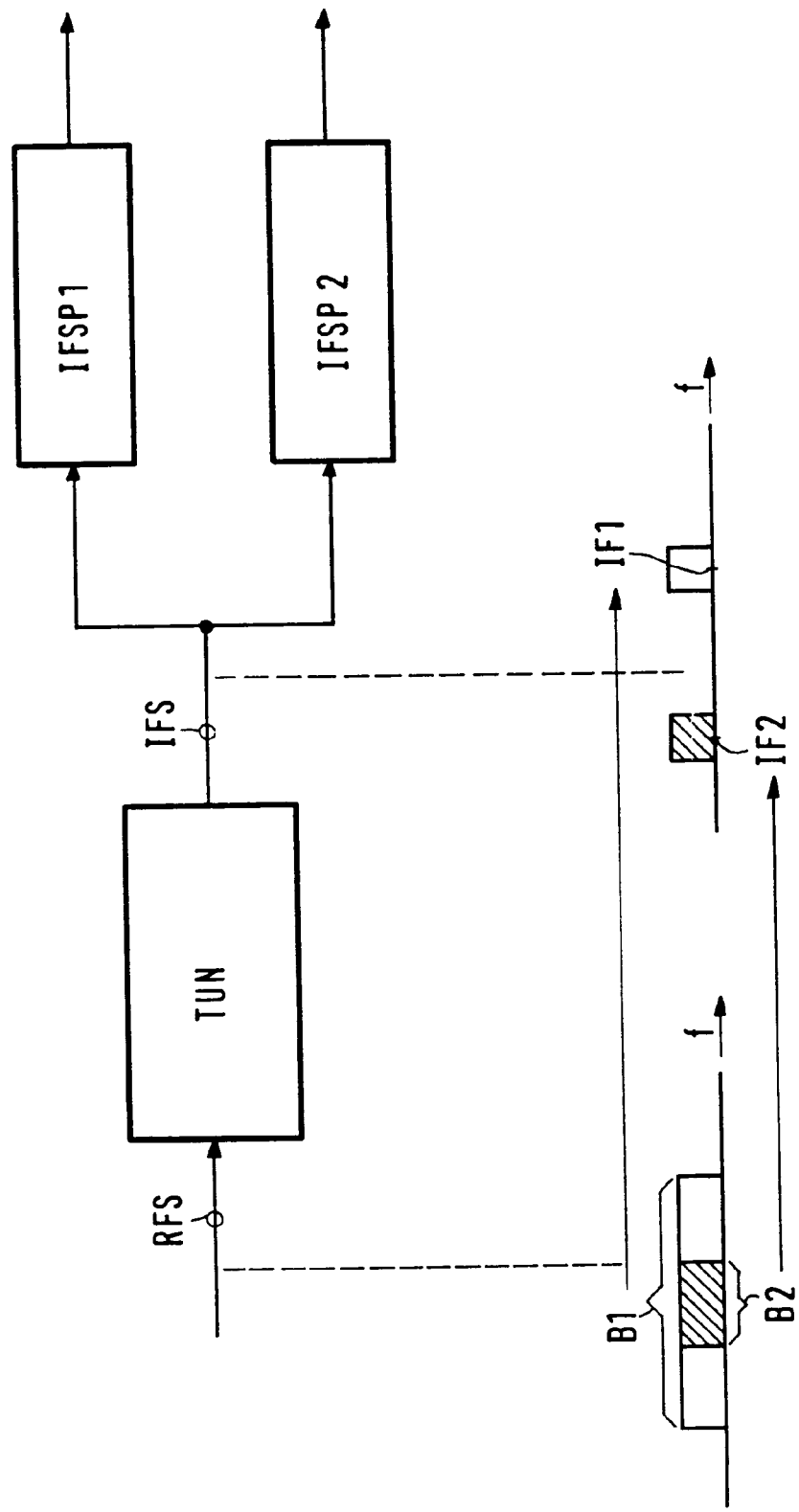
FIG. 1 illustrates the principle of the invention in the form of a conceptual block diagram.

In the FIG. 1 conceptual block diagram, a reception signal RFS may be a reception signal of a first type, for example, a TV signal, located within a frequency band B1. Alternatively, the reception signal RFS may be a reception signal of a second type, for example, an FM-radio signal, located within a frequency band B2. The frequency bands B1 and B2 overlap. A tuner TUN frequency converts the reception signal RFS to an intermediate frequency signal IFS.

Referring to FIG. 1, the principle of the invention can be explained as follows. The receiver is a single conversion receiver for both types of reception signals, the single conversion being effected in the tuner TUN. Depending on whether a first-type or second-type reception signal is desired, the tuner TUN provides the intermediate frequency signal IFS at a first intermediate frequency IF1 or a second intermediate frequency IF2, respectively. The intermediate frequency signal IFS at intermediate frequency IF1 is processed in a first intermediate frequency signal processor IFSP1. Alternatively, the intermediate frequency signal IFS at the second intermediate frequency IF2 is processed in a second intermediate frequency signal processor IFSP2.

Figure 2:
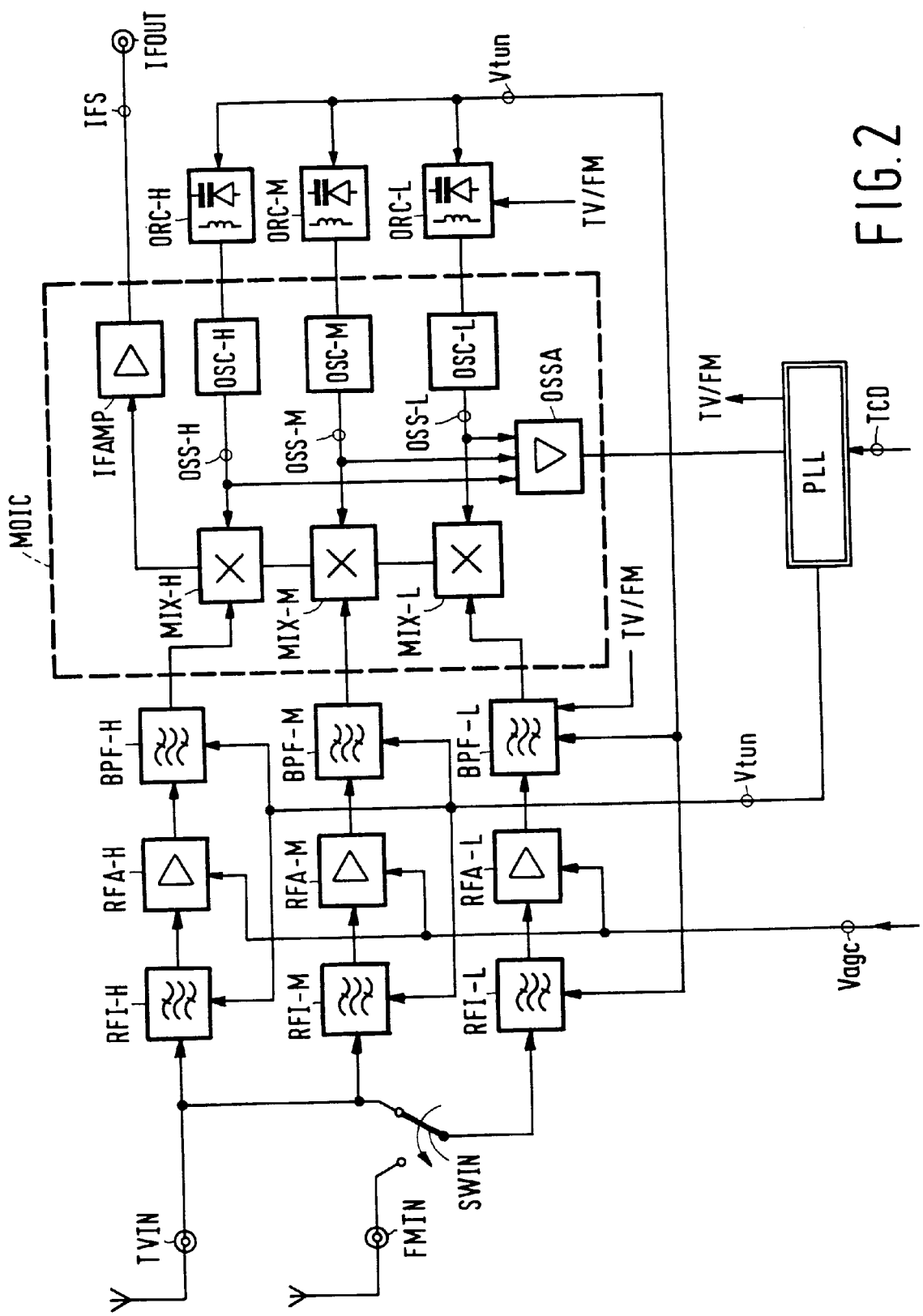
FIG. 2 shows an example of a tuner in accordance with the invention in the form of a block diagram.

Referring now to FIG. 2, the tuner which is suitable for reception of TV and FM-radio signals, will be described. The TV and FM-radio signals may be applied at inputs TVIN and FMIN, respectively. The FIG. 2 tuner receives tuning control data TCD relating to a desired reception signal, for example, the frequency and the type of signal: TV or FM. In response to the desired reception signal, the FIG. 2 tuner provides an intermediate frequency signal IFS at an output IFOUT.

The FIG. 2 tuner can operate in two modes: a TV-mode if the desired reception signal is a TV signal, or an FM-mode if the desired reception signal is an FM-radio signal. In the TV-mode, the intermediate frequency signal IFS is at an intermediate frequency of 38.9 MHz, hereinafter abbreviated to TV-IF. In the FM-mode, the intermediate frequency signal IFS is at an intermediate frequency of 10.7 MHz, hereinafter abbreviated to FM-IF.

The FIG. 2 tuner is based on a so-called three-band concept. This means that the FIG. 2 tuner comprises three separate branches for processing the TV signals in three respective frequency bands: high-band, medium-band and low-band. Each branch comprises the following parts: an input filter RFI-H/-M/-L, an input amplifier RFA-H/-M/-L, a band-pass filter BPF-H/-M/-L, a mixer MIX-H/-M/-L, an oscillator circuit OSC-H/-M/-L and an oscillator resonant circuit ORC-H/-M/-L. The suffixes -H, -M and -L used in the reference signs for these parts indicate whether a relevant part belongs to the high, medium or low-band branch. The FIG. 2 tuner may be implemented by using a mixer-oscillator integrated circuit MOIC, for example of the type TDA 5736 manufactured by Philips Semiconductors, which comprises the parts present within the dotted rectangle designated MOIC in FIG. 2.

In the FIG. 2 tuner, FM-radio signals are processed in the low-band branch. A switch SWIN either couples the low-band branch to the input TVIN or to the input FMIN. In the first case, TV signals are supplied to the low-band branch, in the other case, FM-radio signals are supplied to the low-band branch.

In each branch, the input filter RFI-H/-M/-L attenuates signals which are relatively distant in frequency from the desired reception signal so as, to prevent overload of the input amplifier RFA-H/-M/-L. The amplifier RFA-H/-M/-L is controlled by a gain control voltage Vagc. The band-pass filter BPF-H/-M/-L provides a further attenuation of undesired signals. The mixer MIX-H/-M/-L effects a frequency shift of the desired reception signal by multiplying the desired reception signal with an oscillator signal OSS-H/-M/-L. The oscillator signal OSS-H/-M/-L is generated by the oscillator circuit OSC-H/-M/-L and the oscillator resonant circuit ORC-H/-M/-L, which determines the frequency of the oscillator signal OSS-H/-M/-L. The mixer provides the intermediate frequency signal IFS via an intermediate frequency amplifier IFAMP.

In each branch, a phase-locked loop circuit PLL controls the oscillator signal OSS-H/-M/-L of the relevant branch. The phase-locked loop circuit PLL derives, in a conventional manner, a tuning voltage Vtun from the tuner control data TCD and the oscillator signal OSS-H/-M/-L received via an oscillator signal amplifier OSSA. The tuning voltage Vtun is applied to the oscillator resonant circuit ORC-H/-M/-L. In the TV-mode, the oscillator signal OSS-L in the low band-branch is set to a frequency which is the sum of the desired reception signal and the TV-IF (38.9 MHz). In the FM-mode, the oscillator signal OSS-L is set to a frequency which is the sum of the desired reception signal and the FM-IF (10.7 MHz).

In each branch, the tuning voltage Vtun is also used to vary the respective passbands of the input filter RFI-H/-M/-L and the band-pass filter. Preferably, the passbands should encompass the desired reception signal. If not, the desired reception signal is distorted and undesired signals may not be sufficiently attenuated. In TV-mode, the passbands should encompass the difference of the oscillator signal frequency and the TV-IF. In the FM-mode, the passbands should be centered at the difference of the oscillator signal frequency and the FM-IF. The position of the passbands with respect to the frequency of the oscillation signal, while tuning over the reception bands, is hereinafter referred to as tracking.

The phase-locked loop circuit PLL also provides a mode-switch signal TV/FM. In the low-band branch, the mode-switch signal TV/FM is used to switch the oscillator resonant circuit ORC-L. The oscillator signal OSS-L is switched to a higher frequency in the TV-mode than in the FM-mode, for a given value of the tuning voltage Vtun. Respective passbands of the input filter RFI-L and the band-pass filter BPF-L remain substantially constant for a given value of the tuning voltage Vtun. Thus, the frequency offset between the input filter RFI-L and the band-pass filter BPF-L, on the one hand, and the oscillator signal OSS-L, on the other hand, is switched. The frequency offset is preferably switched to the TV-IF in the TV-mode and to the FM-IF in the FM-mode.

In addition, the mode control signal TV/FM preferably switches the passbandwidth of the band-pass filter BPF-L in the low-band branch. In the TV-mode, the band-pass filter BPF-L has a preferably relatively wide passband, for example, 10 MHz, whereas in the FM-mode, the passband is preferably relatively narrow, for example, 1 MHz.

Figure 3:
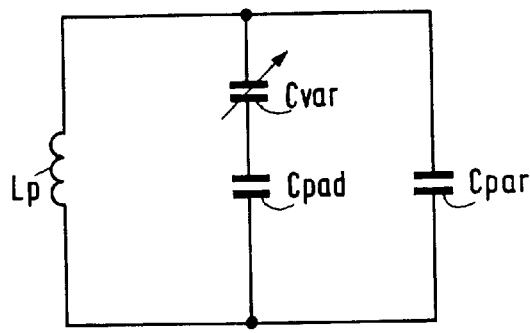
FIG. 3 is a simplified equivalent circuit diagram of resonant circuits for the FIG. 2 tuner.

FIG. 3 shows a basic resonant circuit for implementations of the input filter RFI-L, the band-pass filter BPF-L and the oscillator resonant circuit ORC-L in the low-band branch of the FIG. 2 tuner. The FIG. 3 basic resonant circuit comprises an inductance Lp, a controllable capacitance Cvar, a so-called padder capacitance Cpad and a parallel capacitance Cpar. The value of the controllable capacitance depends on the tuning voltage Vtun. The controllable capacitance may be a varicap diode to which the tuning voltage Vtun is applied in a conventional manner.

In an implementation of the FIG. 2 tuner, identical varicap diodes are used in the input filter RFI-L, the band-pass filter BPF-L and the oscillator resonant circuit ORC-L in the low-band branch. The capacitance of the identical varicap diodes can be varied between 2.5 pF and 61.5 pF as a function of the tuning voltage Vtun. The values of the other elements are preferably chosen to be such that good tracking is obtained, both in the TV-mode and in the FM-mode.

Table 1 shows the preferred values for the other elements in the FIG. 3 basic resonant circuit. The column entitled RF lists the preferred element values for the input filter RFI-L and the band-pass filter BPF-L in the low-band branch. The column entitled RF+38.9 MHz lists the preferred element values for the low-band oscillator resonant circuit ORC-L in the TV-mode. The column RF+10.7 MHz lists the preferred element values for the low-band oscillator resonant circuit ORC-L in the FM-mode. The row entitled F(res) indicates the frequency bands through which the respective basic resonant circuits can be tuned. For example, the band-pass filter BPF-L in the low-band branch is tunable through the frequency band from 46 to 175 MHz.

TABLE 1

|  | RF | RF + 38.9 MHz | RF + 10.7 MHz |
|---|---|---|---|
| Lp | 190 nH | 100,3 nH | 159,6 nH |
| Cpad | 4.7 nF | 68 pF | 184 pF |
| Cpar | 1.926 pF | 3.237 pF | 2.22 pF |
| Fres(MHz) | 46 ... 175 | 84.9 ... 213.9 | 56.7 ... 185.7 |

In the oscillator resonant circuit ORC-L, the inductance Lp should have a higher value in the FM-mode than in the TV-mode. The same applies to the padder capacitance Cpad. However, the parallel capacitance Cpar should be lower in the FM-mode than in the TV-mode.

To obtain preferred element values in the oscillator resonant circuit ORC-L in the FM-mode and in the TV-mode, three switches can be used. Referring to FIG. 3, a series arrangement of a switch and a capacitance, not shown, can be coupled parallel to the padder capacitance Cpad. The same can be coupled parallel to the parallel capacitance Cpar. The inductance Lp can be split up into two inductances in series, not shown, and a switch can be coupled parallel to one of these inductances. Referring to FIG. 2, the switches may be controlled by the mode-switch signal TV/FM.

Figure 4:
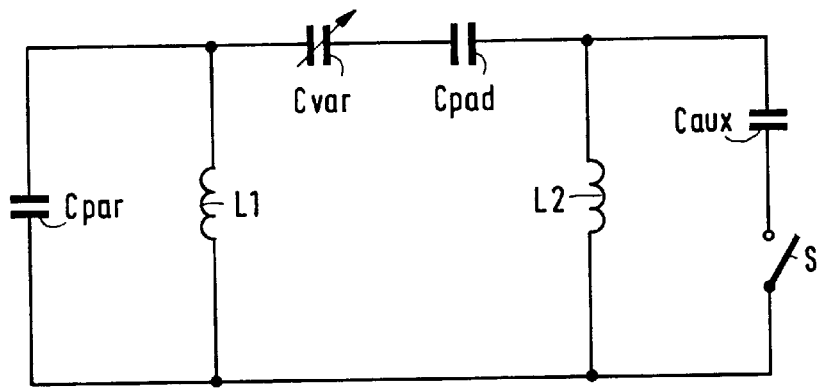
FIG. 4 is an equivalent circuit diagram of preferred switchable oscillator resonant circuits for the FIG. 2 tuner.

FIG. 4 shows an equivalent circuit diagram of preferred implementations of the oscillator resonant circuit ORC-L in the low-band branch of the FIG. 2 tuner. These preferred implementations comprise one switching element, which is represented as a switch S in the FIG. 4 equivalent circuit diagram. The FIG. 4 equivalent circuit diagram comprises a primary inductance L1 and a secondary inductance L2. A series arrangement of a padder capacitance Cpad and a controllable capacitance Cvar is coupled between a node of each of these inductances L1 and L2.

The switch S is coupled parallel to the secondary inductance L2. Furthermore, in FIG. 4, an auxiliary capacitance Caux is coupled in series with the switch S. The auxiliary capacitance Caux is optional. This means that other preferred implementations of the oscillator resonant circuit, may have an equivalent circuit diagram in which switch S is directly coupled parallel to the secondary inductance L2, shown in FIG. 4.

The switch S shown in FIGS. 2 and 4 is controlled by the mode switch signal TV/FM. In the FM-mode, the switch S is opened, whereas in the TV-mode, the switch S is closed. Thus, in the FM-mode, both the primary and the secondary inductance L1 and L2 will influence the frequency of the oscillator signal, whereas in the TV-mode, the primary inductance L1 will substantially influence the frequency. The value of the primary inductance L1 and the value of the secondary inductance L2 preferably have a ratio of approximately 1.5 to 1.

Figure 5:
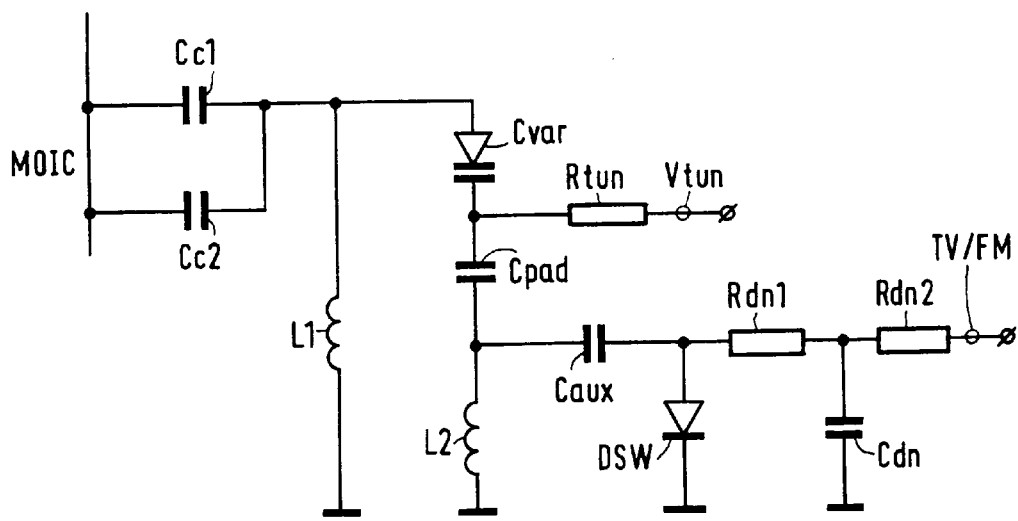
FIG. 5 shows, in a circuit diagram form, an example of a preferred switchable oscillator resonant circuit for the FIG. 2 tuner.

FIG. 5 shows an example of a preferred implementation of the oscillator resonant circuit ORC-L in the FIG. 2 tuner. In the FIG. 5 example, a switching diode Dsw effectively corresponds to the switch S in the FIG. 4 equivalent circuit diagram. The switching mode signal TV/FM is applied to the switching diode Dsw via a network comprising resistors Rdn1 and Rdn2 and a capacitor Cdn. The network constitutes a frequency-dependent damping network which is coupled parallel to the secondary inductance L2. The tuning voltage Vtun is applied to the varicap diode Cvar via a resistor Rtun. The FIG. 5 example further includes two capacitors Cc1 and Cc2 for coupling to the mixer oscillator integrated circuit MOIC, for example, of the type TDA 5736 produced by Philips Semiconductors.

The values for the following components in the FIG. 5 example provided a satisfactory tracking:

Cc1, Cc2: 2.7 pF
Cpad: 120 pF
Caux: 180 pF
Cvar: type BB 132 or type HVU 300A
L1: approximately 100 nH (adjustable value)
L2: approximately 67 nH (adjustable value)

The values of some other components, which are less crucial to tracking, are as follows:

Cdn: 3,3 pF
Rdn1: 220 Ω
Rdn2: 750 Ω

Figure 6A:
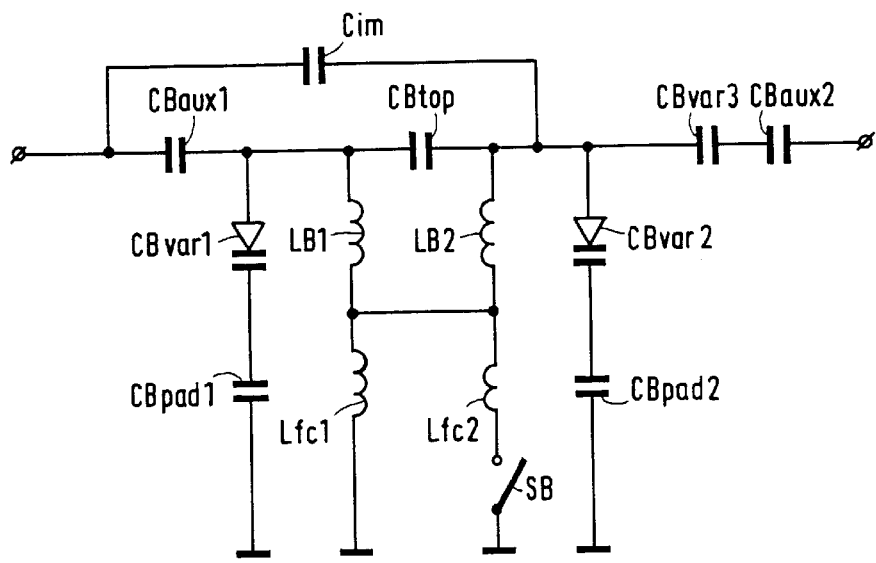
FIG. 6a is an equivalent circuit diagram of switchable band-pass filters for the FIG. 2 tuner.

FIG. 6a is an equivalent circuit diagram of a band-pass filter for use in the low-band branch of the FIG. 2 tuner. In the FIG. 6a circuit diagram, there are two resonant circuits. A first resonant circuit includes an inductance LB1, a controllable capacitance CBvar1 and a capacitance CBpad1. A second resonant circuit includes an inductance LB2, a controllable capacitance CBvar2 and a capacitance CBpad2. The FIG. 6a circuit diagram further includes auxiliary capacitances CBaux1 and CBaux2, an auxiliary variable capacitance CBvar3 and an image suppression capacitance Cim.

The two resonant circuits in FIG. 6a are mutually coupled by means of a top-coupling capacitance CBtop and by means of a primary foot-coupling inductance Lfc1. Furthermore, a series arrangement of a secondary foot-coupling inductance Lfc2 and a switch SB is coupled parallel to the primary foot-coupling inductance Lfc1. Accordingly, a switchable inductive foot-coupling is obtained. When the switch SB is closed, the inductive foot-coupling is weaker than when the switch SB is opened.

Referring to FIGS. 2 and 6a, the mode control signal TV/FM controls the switch SB. In the TV-mode, the switch SB is opened so as to obtain an over-critical coupling between the two resonant circuits in FIG. 6a. In the FM-mode, the switch SB is closed so as to obtain an under-critical coupling between the two resonant circuits in FIG. 6a.

Figure 6B:
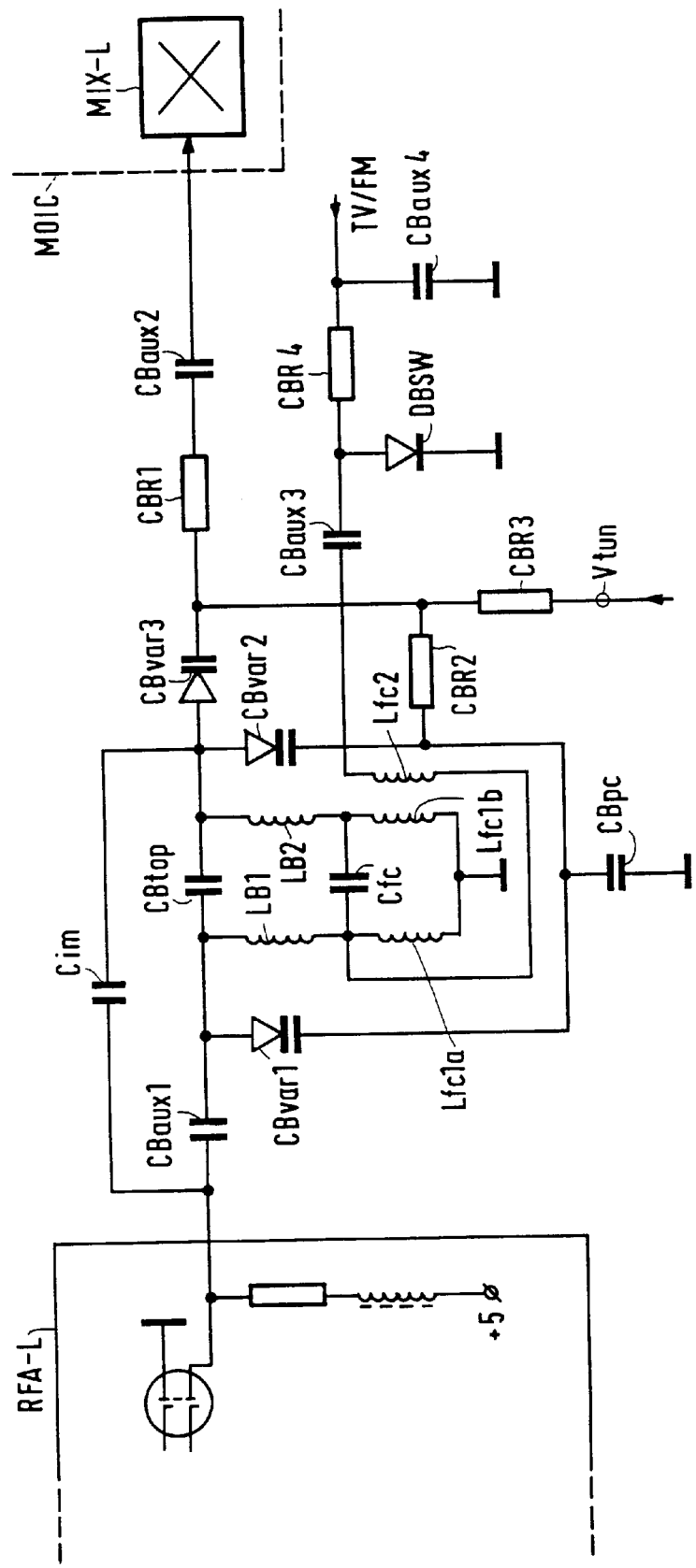
FIG. 6b shows, in a circuit diagram form, an example of a switchable band-pass filter implementation in the FIG. 2 tuner.

FIG. 6b shows an implementation of the band-pass filter BPF-L which is coupled between the input amplifier RFA-L and the mixer MIX-L in the low-band branch of the FIG. 2 tuner. The FIG. 6b implementation has the following particularities as compared with the FIG. 6a circuit. First, in the FIG. 6b implementation, the primary foot-coupling inductance Lfc1 is implemented by means of two foot-coupling inductors Lfc1a and Lfc1b. Each of the two foot-coupling inductors Lfc1a and Lfc1b has one end which is coupled to the inductors LB1 and LB2, respectively, and to the other coupling inductor via a foot-coupling capacitance Cfc. The impedance of the foot-coupling capacitance Cfc is relatively low at frequencies with the low-band and may, by approximation, be regarded as a short circuit.

A second particularity of the FIG. 6b implementation, as compared with the FIG. 6a circuit, is that a single capacitor CBpc in FIG. 6b provides the two separately shown capacitances CBpad1 and CBpad2 in FIG. 6a. The reason for using the single capacitor CBpc is component-efficiency and the fact that the filter characteristics are hardly affected by this. In an implementation of the FIG. 6a circuit as band-pass filter BPF-L in the FIG. 2 tuner, the preferred values of capacitances Cpad1 and Cpad2 are relatively high. The capacitor CBpc in the FIG. 6b implementation effectively provides the two high-value capacitances Cpad1 and Cpad2, shown in FIG. 6a, which are present between the controllable capacitances CBvar1 and CBvar2, respectively, and signal ground. Due to the fact that the capacitor CBpc in the FIG. 6b implementation has a high value and, consequently, a relatively low impedance, there is little coupling between the resonant circuits as a result of the capacitor CBpc, which coupling could affect the filter characteristics.

In the FIG. 6b implementation, varicap diodes form the controllable capacitances CB1var1, CBvar2 and CBvar3. The varicap diodes receive the tuning voltage Vtun via at least one of the resistors CBR2 and CBR3. A resistor CBR1 is coupled in series with the auxiliary capacitor CBaux2 so as, to optimize the coupling with the mixer MIX-L.

In the FIG. 6b implementation, a switching diode DBsw effectively constitutes the switch S shown in FIG. 6a. In the TV-mode, the switching diode Dsw is non-conductive so as to obtain an over-critical coupling between the resonant circuits. In the FM-mode the switching diode Dsw is conductive so as to obtain an under-critical coupling between the resonant circuits. In addition, the following elements are used for switching the coupling between over-critical and under-critical. An auxiliary capacitor CBaux3 couples the switching diode DBsw to the secondary foot-coupling inductance Lfc2. The mode switch signal TV/FM in the FIG. 2 tuner is applied to the switching diode via a resistor CBR4. An auxiliary capacitor CBaux4 suppresses unwanted feedthrough of signals from the inductive foot-coupling onto the line conveying the TV/FM mode switch signal.

In the FIG. 6b implementation, the following component values provided a satisfactory performance:

Cim: 0.06 pF
CBaux1: 2 pF
CBtop: 0.1 pF
Cfc: 680 pF
CBpc: 4.7 nF
LB1, LB2: 175 nH
Lfc1a, Lfc1b: 32 nH
Lfc2: 6 nH Values of components which are not listed above are less critical for the filter characteristics.

Not all the electrical elements shown in FIG. 6b need to be realized with discrete components. In particular, the image capacitance Cim, the top-coupling capacitance CBtop and the secondary foot-coupling inductance LFc2 may be obtained by a suitable lay-out of a printed circuit board (PCB) used to realise the FIG. 6b circuit. For example, a PCB-track may constitute the foot-coupling inductance Lfc2. In addition, a stray inductance of the switching diode DBsw may also effectively contribute to the foot-coupling inductance Lfc2. Capacitive coupling between relevant PCB-tracks may provide the image capacitance Cim and, likewise, the top-coupling capacitance CBtop can be obtained, as well as any other capacitance of relatively small value.

Figure 7:
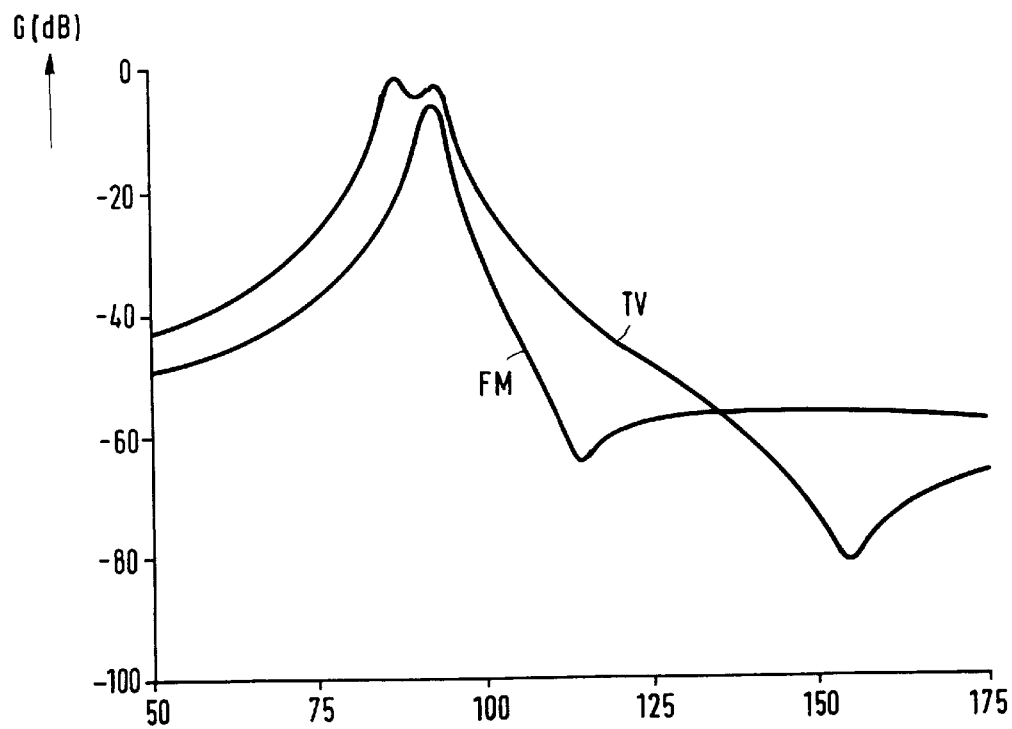
FIG. 7 illustrates the filter characteristic of the FIG. 6 circuit by means of gain-versus-frequency plots.

FIG. 7 illustrates filter characteristics of the FIG. 6b implementation, with the values listed above and for a certain value of the tuning voltage Vtun. In FIG. 7, gain G expressed in decibels (dB) is plotted on the vertical axis, and frequency expressed in MegaHertz (MHz) is plotted on the horizontal axis. FIG. 7 includes two plots of gain-versus-frequency: one plot denoted as TV and one denoted as FM, which illustrate the filter-characteristics in the TV and FM-modes, respectively.

FIG. 7 clearly shows differences between the filter characteristics in TV and FM-modes, of the FIG. 6b implementation. First, the passband in the filter characteristic is narrower in the FM-mode than in the TV-mode. In TV-mode, the −3 dB passband is about 10 MHz wide, which is somewhat wider than the bandwidth of a TV reception signal. In the FM-mode, the −3 dB passband is reduced to about 2.5 MHz.

Secondly, in the band-pass the TV mode has two peaks, whereas in the FM-mode the passband is a single peak. The two peaks are a clear result of the over-critical coupling, in the TV-mode, between the resonant circuits in the FIG. 6b implementation. The single peak results from the under-critical coupling, in the FM-mode, when the switching diode Dsw is non-conductive.

Thirdly, the center frequency of the passband in the FM-mode is slightly higher than in the TV-mode. In other words, when the state of the switching diode Dsw is changed, a small de-tuning occurs. The de-tuning is caused by switching the inductive foot-coupling between the resonant circuits in the FIG. 6b implementation. The switching changes the effective inductance values in the resonant circuits, and thereby the resonance frequencies. Referring to the FIG. 2 tuner, de-tuning of the band-pass filter BPF-L when switching from the TV-mode to the FM-mode, or vice versa, poses no real problem. Any de-tuning can be accounted for in the alignment of the oscillator resonant circuit ORC-L, for example, which alignment is made to obtain a satisfactory tracking. It is also possible to correct the input filter IPF-L in view of any de-tuning in the band-pass filter BPF-L.

Fourthly, the passband gain is somewhat lower in FM-mode than in TV-mode. This effect is also related to the coupling between the resonant circuits in the FIG. 6b implementation. With an under-critical coupling there is more signal loss in the FIG. 6b implementationly, than with an over-critical coupling.

Fifthly, the filter characteristics include notches which are different in the TV and in the FM-modes. In the TV-mode, a notch is located approximately 2 times the TV-IF above the passband. In the FM-mode, a notch is located approximately 2 times the FM-IF above the passband. The notches contribute to the image suppression which is required in the reception signal path to the mixer MIX-L. The notches are highly influenced by the image capacitance Cim, which can be explained as follows.

The secondary resonant circuit, which includes inductance LB2, receives a signal via the image capacitance Cim. The secondary resonant circuit also receives a signal via the primary resonant circuit, which includes inductance LB1. At resonance frequency, these signals are in phase and the image capacitor Cim contributes to the capacitive top-coupling, similarly to the top-coupling capacitance CBtop. However, at a certain frequency, relatively far above the resonance frequency, the signals will be in anti-phase and may substantially cancel each other. This manifests itself as the notches shown in FIG. 7. By properly choosing components values, it is possible to position the notches in such a way that they substantially contribute to the image suppression, as shown in FIG. 7, both in the TV-mode and in the FM-mode. Thus, when switching from the TV-mode to the FM-mode, or vice versa, the image suppression adjusts itself in accordance with the new IF.

Figure 8:
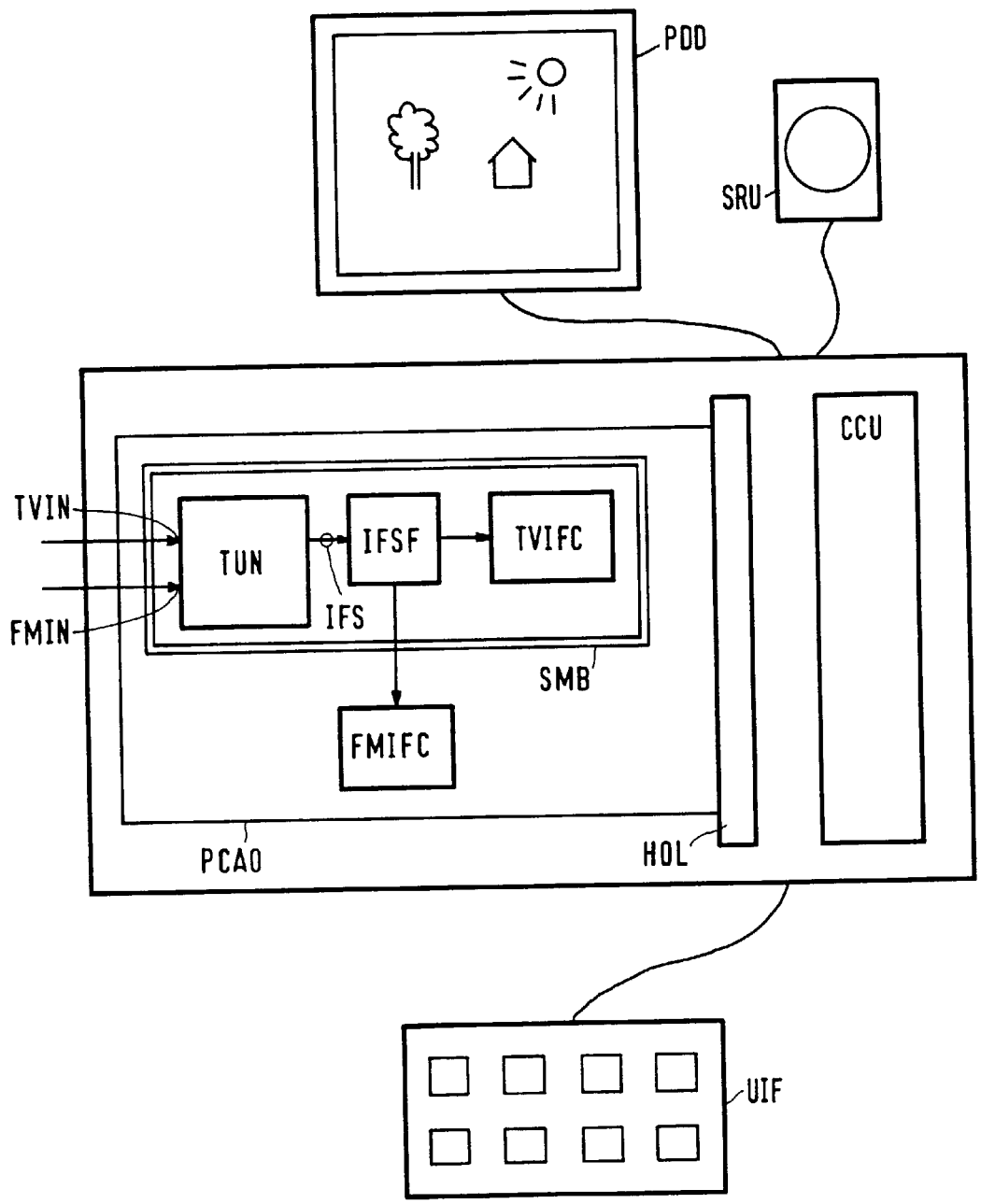
FIG. 8 shows, in an abstract diagram form, an example of a multimedia apparatus comprising the FIG. 2 tuner.

FIG. 8 shows an example of a multimedia apparatus comprising the FIG. 2 tuner TUN. The FIG. 2 tuner TUN is implemented on an add-on card PCAO, which add-on cart PCAO is plugged into an add-on card holder HOL of the multi-media apparatus. Apart from the FIG. 2 tuner TUN, the add-on card includes TV IF signal processing circuitry TVIFC and FM IF signal processing circuitry FMIFC. The latter circuitries receive the intermediate frequency signal IFS provided by the FIG. 2 tuner TUN via an IF splitting filter IFSF. The FIG. 2 tuner TUN, the IF splitting filter IFSF and the TV IF signal processing circuitry TVIFC are housed in a shielded metal box SMB. The shielded metal box SMB with the aforementioned parts may be manufactured as such and sold to add-on card manufacturers.

The FIG. 8 multimedia apparatus includes a user interface UIF, a control unit CCU, a picture display device PDD, a sound reproduction unit SRU. A user selects the desired reception signal via the user-interface UIF. For example, he may enter a program number on a keyboard which is part of the user-interface UIF. The control unit CCU effectively controls the add-on card PCAO in such a way that the FIG. 2 tuner TUN selects the desired reception signal. For example, the control unit CCU provides instructions which are stored in a memory (not shown) relating to the frequency of the desired reception signal and the type of signal: FM or TV. These instructions are supplied to the FIG. 2 tuner TUN in the form of the tuner control data TCD. The add-on card PCAO provides sound and/or video information, for example, obtained from the desired reception signal, which information may be further processed in the control unit CCU. The sound and/or video information is provided to the user via the sound reproduction unit SRU and the picture display device PDD, respectively.

Advantageous implementation details, are highlighted below with reference to the above examples.

In the FIG. 2 example, the oscillator in the low-band branch, formed by the oscillator circuit OSC-L and the oscillator resonant circuit ORC-L, is switchable in frequency for providing the intermediate frequency signal IFS either at the TV-IF or at the FM-IF. This is a smaller, simpler and cheaper implementation than an alternative implementation in which the band-pass filter BPF-L and the input filter RFI-L in the low-band branch are switched. In the alternative implementation, more switches would be required.

In the FIG. 4 example, the oscillator resonant circuit includes two inductances: the primary and the secondary inductance. The frequency switching of the oscillator is effected by means of the switch S, which is coupled parallel to the secondary inductance. This is a simple and cheap implementation of switching an oscillator in frequency. Moreover, alignment of the oscillator frequency for the FM-mode and the TV-mode is relatively easy.

In the FIG. 4 example, the switch S is preferably conducting for receiving TV signals and non-conducting for receiving FM-radio signals. This provides a satisfactory compromise between the signal-to-noise ratios for TV and FM-radio reception, which can be explained as follows. In practice, the switch S will provide a series resistance in the closed condition. Although it is relatively small, the series resistance deteriorates the phase-noise performance of the oscillator to some extent. With respect to the signal-to-noise ratio, the phase-noise performance is more critical for reception of FM signals, such as FM-radio, than for AM signals, such as TV. To achieve the best phase-noise performance, the switch S is preferably opened at FM-reception.

In the FIG. 4 example, a series arrangement of the controllable capacitance Cvar and the padder capacitance Cpad is coupled between the primary inductance L1 and the secondary inductance L2. These implementation details provide a very satisfactory tracking, which can be explained as follows. Opening of the switch S produces the following effects. First, the effective inductance is increased. Secondly, the effective parallel capacitance is decreased due to an impedance transformation. The impedance transformation depends on the ratio of the primary inductance to the secondary inductance. Accordingly, by suitably choosing this ratio, a satisfactory tracking can be achieved.

In the FIG. 4 example, the auxiliary capacitance Caux is coupled in series with the switch S, and together with the switch S, it is coupled in parallel with the secondary inductance L2. This implementation detail provides an improved tracking, which can be explained as follows. Referring to FIG. 3 and Table 1, the padder capacitance Cpad preferably has a higher value in the FM-mode than in the TV-mode. Referring again to FIG. 4, the auxiliary capacitance Caux can be seen to effectively lower the value of the FIG. 3 padder capacitance Cpad, when the switch S is closed.

In the FIG. 5 example, the resistors Rdn1 and Rdn2 and the capacitor Cdn form a frequency-dependent damping network to counter a parasitic oscillation at a frequency higher than the desired oscillation frequency. The damping network effectively increases the loss at the parasitic resonance frequency with respect to the loss at the desired oscillation frequency.

In a tuner equipped with a FIG. 4 type of oscillator resonant circuit, there is preferably an oscillation detector for decreasing the value of the controllable capacitance Cvar when the oscillator is not oscillating. This prevents a deadlock in the frequency control of the oscillator, which can be explained as follows. The FIG. 4 type of oscillator resonant circuit has a relatively low impedance, particularly when tuned to relatively low resonance frequencies and when the switch S is open (FM-mode). If the impedance is too low, the oscillator may simply not oscillate, so that a frequency control cannot be effected. This problem is solved by detecting a non-oscillatory condition and, in response thereto, by increasing the value of the controllable capacitance. Accordingly, the oscillator will be pulled out of the non-oscillatory condition, so that the frequency control can be effected. Referring to the FIG. 2 tuner, the phase-locked loop circuit PLL preferably includes an oscillation detector for that purpose.

In the FIG. 2 example, the band-pass filter BPF-L in the low-band is switchable for filtering TV signals and FM-radio signals differently. This provides a better reception quality, in particular for FM-radio, than in the case where the band-pass filter BPF-L would be fixed.

The FIG. 4 oscillator resonant circuit is preferably tuned in accordance with the following method, when it has to operate in a mode where the switch S is opened. First, the switching element S is made conducting. Secondly, the oscillator is tuned to a desired frequency. Thirdly, the switching element S is made non-conducting. Fourthly, and finally, the oscillator is corrected to the desired frequency. This method counters erroneous tuning which may result from a parasitic resonance in the FIG. 4 circuit, when the switch S is opened.

Evidently, the invention may be implemented differently from the examples described above. To indicate that the scope of the invention is well beyond the examples described above, some final remarks are made.

It should be noted that the invention is not limited to combined TV and FM-radio reception. For example, the invention can be used in TV reception only, for example, to implement a TV tuner for receiving both US and European types of TV signals. In the US, an IF of 45.75 MHz is preferred, whereas in most European countries an IF of 38.9 MHz is preferred. Accordingly, the principle of the invention to have a tuner capable of providing various IF frequencies, such as 45.75 and 38.9 MHz, can be used.

It should also be noted that the invention is not limited to two different IF frequencies provided by a single tuner. For example, the single tuner may provide the following three different IF frequencies: 38.9 MHz IF for European TV signals, 45.75 MHz for US TV signals and 10.7 MHz for FM-radio signals.

It should also be noted that the invention is not limited to a 3-band tuner concept, as shown in FIG. 2. In principle, the invention may be applied in any tuner concept, for example in a 2-band tuner concept.

It should further be noted that the invention is not limited to multimedia applications. The invention may be used in any apparatus comprising a receiver, such as TV receivers and video-tape recorders.

Finally, it should be noted that the parallel capacitance Cpar shown in the FIGS. 3 and 4 examples does not need to be a discrete capacitor. The parallel capacitance may be formed by parasitic capacitances of one or more elements which, in practice, are coupled to the FIG. 3 and 4 circuits, but not shown. In that respect, reference is made to the FIG. 5 example, in which no discrete capacitor is present which is directly related to the parallel capacitance Cpar in FIGS. 3 and 4.

What is claimed is:

1. A receiver for receiving reception signals of a first type and a second type, the receiver comprising:

a tuner for providing an intermediate frequency signal in response to a reception signal;

a first intermediate frequency signal processing arrangement coupled to said tuner for processing said intermediate frequency signal when said reception signal is of said first type; and a second intermediate frequency signal processing arrangement coupled to said tuner for processing said intermediate frequency signal when said reception signal is of said second type, characterized in that said receiver is a single conversion receiver, and said tuner provides a mixing signal at one frequency for generating said intermediate frequency signal at a first intermediate frequency, using a single frequency conversion from a frequency of the reception signal to said first intermediate frequency, for processing in said first intermediate frequency signal processing arrangement, and alternatively provides a mixing signal at another frequency, different from said one frequency, for generating said intermediate frequency signal at a second intermediate frequency, also using a single frequency conversion, for processing in said second intermediate frequency signal processing arrangement.

2. The receiver as claimed in claim 1, characterized in that said tuner comprises an oscillator switchable in frequency for providing said mixing signal selectively at said one frequency and at said other frequency for generating said intermediate frequency signal selectively at the first intermediate frequency and at the second intermediate frequency.

3. The receiver as claimed in claim 2, characterized in that the oscillator comprises a resonant circuit having a primary inductance, a secondary inductance and a switching element, coupled in parallel to the secondary inductance, for switching the frequency of the oscillator.

4. The receiver as claimed in claim 3, characterized in that the switching element is conducting for receiving an AM reception signal and non-conducting for receiving an FM reception signal.

5. The receiver as claimed in claim 3, characterized in that the resonant circuit comprises a series arrangement of a controllable capacitance and a padder capacitance, said series arrangement being coupled between the primary inductance and the secondary inductance.

6. The receiver as claimed in claim 5, characterized in that the resonant circuit further comprises an auxiliary capacitance coupled in series with the switch, said auxiliary capacitance, together with the switch, being coupled in parallel with the secondary inductance.

7. The receiver as claimed in claim 5, characterized in that the resonant circuit further comprises a frequency-dependent damping network.

8. The receiver as claimed in claim 5, characterized in that the receiver further comprises an oscillation detector for decreasing a value of the controllable capacitance when the oscillator is not oscillating.

9. The receiver as claimed in claim 1, characterized in that the tuner comprises a switchable band-pass filter for filtering reception signals of the first and second types differently.

10. A multimedia apparatus comprising:
   a receiver for receiving reception signals of a first type and a second type; and
   a control unit for controlling said receiver and for processing data signals, said receiver comprising:
   a tuner for providing an intermediate frequency signal in response to a reception signal;
   a first intermediate frequency signal processing arrangement coupled to said tuner for processing said intermediate frequency signal when said reception signal is of said first type; and
   a second intermediate frequency signal processing arrangement coupled to said tuner for processing said intermediate frequency signal when said reception signal is of said second type, characterized in that said receiver is a single conversion receiver, and said tuner provides a mixing signal at one frequency for generating said intermediate frequency signal at a first intermediate frequency, using a single frequency conversion from a frequency of the reception signal to said first intermediate frequency, for processing in said first intermediate frequency signal processing arrangement, and alternatively provides a mixing signal at another frequency, different from said one frequency, for generating said intermediate frequency signal at a second intermediate frequency, also using a single frequency conversion, for processing in said second intermediate frequency signal processing arrangement.

11. A method of tuning a receiver as claimed in claim 5, characterized in that the method comprises the steps:
   rendering the switching element conducting;
   tuning the oscillator to a desired frequency;
   rendering the switching element non-conducting; and
   correcting the oscillator to the desired frequency.

12. A shielded metal box comprising a tuner for providing an intermediate frequency signal in response to a reception signal, characterized in that said tuner is a single conversion tuner arranged to provide a mixing signal at one frequency for generating said intermediate frequency signal at a first intermediate frequency, using a single frequency conversion from a frequency of the reception signal to said first intermediate frequency, and, alternatively, to provide a mixing signal at another frequency, different from said one frequency, for generating said intermediate frequency signal at a second intermediate frequency, also using a single frequency conversion.

* * * * *